United States Patent [19]
Furino, Jr.

[11] Patent Number: 5,214,329
[45] Date of Patent: May 25, 1993

[54] BIAS CURRENT MODULATION FOR DIFFERENTIALLY COUPLED TRANSISTOR CIRCUIT

[75] Inventor: James P. Furino, Jr., Wyomissing, Pa.

[73] Assignee: Harris Corporation, Melbourne, Fla.

[21] Appl. No.: 819,748

[22] Filed: Jan. 13, 1992

Related U.S. Application Data

[63] Continuation of Ser. No. 447,275, Dec. 7, 1989, abandoned.

[51] Int. Cl.$^5$ .......................... H03F 1/30; H03F 3/45
[52] U.S. Cl. ................................. 307/491; 307/494; 307/350; 330/261; 330/255
[58] Field of Search ............... 307/490, 491, 494, 350, 307/353, 362; 330/254, 257, 267, 261, 288

[56] References Cited

U.S. PATENT DOCUMENTS 4,780,688 10/1988 Groom .............................. 330/261

Primary Examiner—Timothy P. Callahan
Attorney, Agent, or Firm—Evenson, Wands, Edwards, Lenahan & McKeown

[57] ABSTRACT

Improved operation of a differentially coupled transistor circuit is achieved by modulating the circuit's bias current as a function of the input differential voltage. The bias current-modulated, differentially coupled transistor circuit includes first and second differentially transistor pairs, the bases of which are coupled across input terminals to which the differential voltage is applied. The emitters of the first transistor pair are coupled in common to a first constant bias current source, and the emitters of the second transistor pair are coupled in common to a second constant bias current source. The collector of one of the transistors of the first pair is coupled to the collector of the differentially coupled transistor of the second pair, so as to provide a first summation collector current. Similarly, the collector of one of the transistors of the second pair is coupled to the collector of the differentially coupled transistor of the first pair, so as to provide a second summation collector current. The emitters of transistors of a third differentially coupled pair are coupled in common to a modulated bias current source, the output of which is a function of the sum of one of the second collector currents. Output current is derived from one or both collectors of the third pair.

10 Claims, 5 Drawing Sheets

BIAS CURRENT MODULATION FOR DIFFERENTIALLY COUPLED TRANSISTOR CIRCUIT

This is a continuation of application Ser. No. 447,275, filed Dec. 17, 1989, now abandoned.

FIELD OF THE INVENTION

The present invention relates in general to differentially coupled transistor circuits and is particularly directed to a multiple differentially coupled transistor circuit having bias current modulation as a DC coupled function of the circuit's differential input voltage.

BACKGROUND OF THE INVENTION

A fundamental building block of integrated circuit-configured signal processing architectures is the constant current-biased, differentially coupled, transistor pair, diagrammatically illustrated in FIG. 1 as comprising first and second bipolar transistors 11 and 21, the emitters 12 and 22 of which are coupled to a constant bias current source 30 and the bases 13, 23 of which are coupled across an input voltage source 40. Collectors 14, 24 are coupled to a collector bias voltage (not shown) and respectively couple a first collector current I1 and a second collector current I2 in accordance with the following simplified expressions (1) and (2). Specifically, $$I1 = Ic/(1 + (A2/A1)\exp(-V40/VT)) \quad (1)$$

and $$I2 = Ic(1 - 1/(1 + (A2/A1)\exp(-V40/VT)) \quad (2)$$

where A1 and A2 are the emitter areas of transistors 11 and 12, respectively. $VT = KT/q$ As can be seen from expressions (1) and (2), if the differential input voltage $V40 >> KT/q$, I1 approaches Ic and I2 approaches zero. Conversely, if $V40 << -KT/q$, then I1 approaches zero and I2 approaches Ic. In other words, when the differential input voltage lies outside these limits, one of transistors 11 or 21 will be conducting, while the other will not. This imbalance in current flow causes a relative change in temperature due to the difference in power dissipation. (Assuming matched devices), when both transistors are at the same temperature and the differential input voltage drops to zero, each of I1 and I2 = Ic/2. However, if there is a difference in temperature of the two transistors, their collector currents will differ when the differential input voltage drops to zero. Because the bias current Ic is fixed, there exists an inherent differential power and temperature problem that relaxes only for prescribed sets of conditions.

SUMMARY OF THE INVENTION

In accordance with the present invention, the operational limitations of a conventional differentially coupled transistor circuit, employing a constant current bias source, are substantially improved by means of a configuration which effectively modulates the bias current as a DC coupled function of the differential input voltage. When the circuit is incorporated as part of a comparator, modulation of the bias current can be used to reduce power dissipation when a large differential input voltage is applied, thereby helping maintain the differentially coupled transistors at a constant temperature. In addition, when applied to an operational amplifier, bias current modulation provides slew enhancement.

Pursuant to a preferred embodiment of the present invention, modulation of the bias current is achieved by means of a differentially coupled transistor circuit which contains a bias current source whose output current is a function of cross-coupled collector currents. More particularly, the bias current-modulated, differentially coupled transistor circuit according to the present invention includes first and second differentially transistor pairs, the bases of which are coupled across input voltage terminals. The emitters of the first transistor pair are coupled in common to a first constant bias current source, and the emitters of the second transistor pair are coupled in common to a second constant bias current source. The collector of one of the transistors of the first pair is coupled to the collector of the differentially coupled transistor of the second pair, so as to provide a first summation collector current. Similarly, the collector of one of the transistors of the second pair is coupled to the collector of the differentially coupled transistor of the first pair, so as to provide a second summation collector current. The circuit also includes a third differentially coupled transistor pair, the bases of which are coupled across the input terminals and the emitters of which are coupled in common to a third bias current source. The collectors of both of the transistors of the third pair provide current output. The emitters of the transistors of the third pair are coupled in common to a modulated bias current source, the output of which is a function of the sum of one of the first and second collector currents. Namely, the third bias current source is a current-dependent current source. By adjustment of the emitter areas of the transistors of the first and second transistor pairs, the modulated bias current may be controlled to have either its maximum or its minimum value for a zero input voltage and, conversely, its minimum or maximum value when its input voltage is outside the above-referenced KT/q limit.

DETAILED DESCRIPTION

As mentioned briefly above, pursuant to the present invention, the performance of a conventional differentially coupled transistor pair, which employs a constant current bias source, is substantially improved by a modification that enables the bias current to be effectively modulated as a DC coupled function of the differential input voltage. When the circuit is incorporated as part of a comparator, modulation of the bias current can be used to reduce power dissipation when a large differential input voltage is applied, thereby helping maintain the differentially coupled transistors at a constant temperature. In addition, when applied to an operational amplifier, bias current modulation provides slew enhancement.

Figure 1:
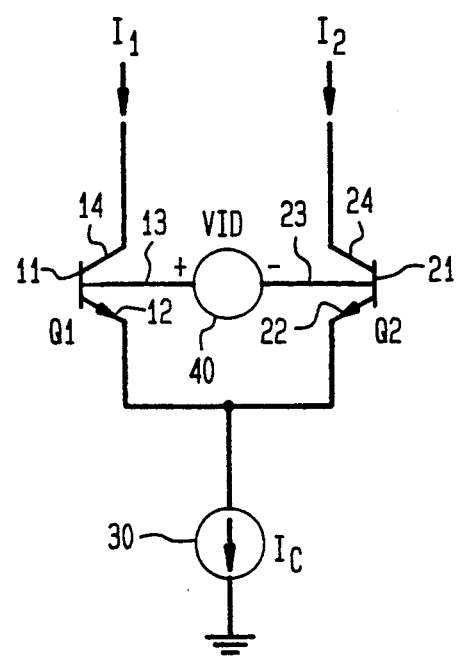
FIG. 1 diagrammatically illustrates a conventional constant current-biased, differentially coupled, transistor pair.
Figure 2:
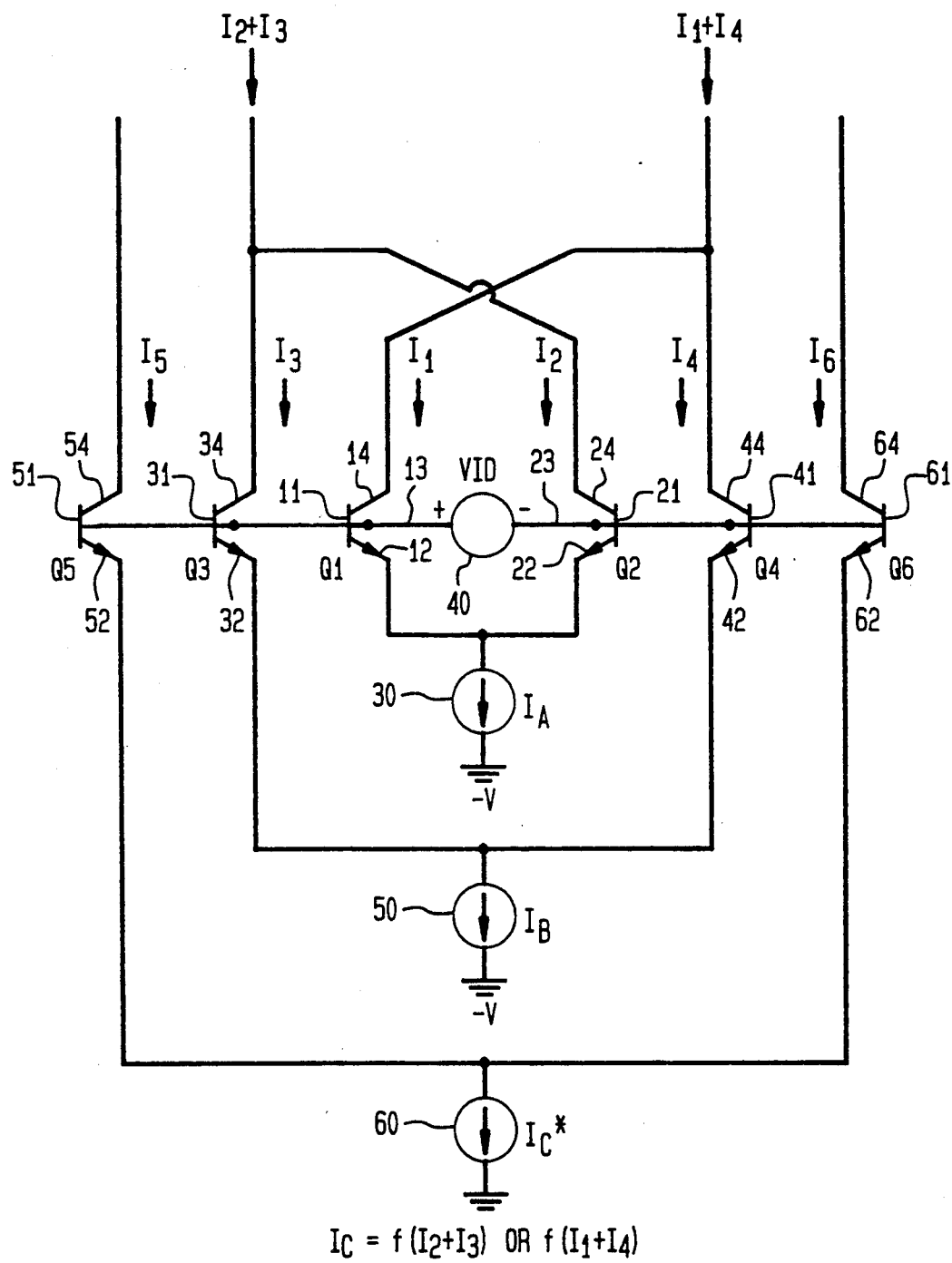
FIG. 2 diagrammatically illustrates a modulated bias current, differentially coupled, transistor circuit, in accordance with an embodiment of the present invention.

The basic configuration of a preferred embodiment of the present invention is diagrammatically illustrated in FIG. 2 as comprising three differentially coupled (NPN) bipolar transistor pairs, respectively identified as transistor pair 11, 21, transistor pair 31, 41 and transistor pair 51, 61. (While a representative embodiment of the invention is shown as comprising bipolar transistors, it should be observed that the invention is not limited to these specific components, nor their polarity types, but may implemented using other types of active signal gain control elements, such as JFET or MOSFET devices.) The bases of transistors 11, 31 and 51 are coupled to a first (+) terminal of input voltage source 40 and the bases of transistors 21, 41 and 61 are coupled to a second (−) terminal of voltage source 40. The emitters 12, 22 of respective transistors 11 and 21 are coupled in common to a first constant bias current source 30 and the respective emitters 32, 42 of transistor pair 31, 41 are coupled in common to a second constant bias current source 50. The respective emitters of transistor pair 51, 61 are coupled in common to a third, modulated bias current source 60, the output current of which is a function of the sum of cross-coupled collector currents of the one of the first and second transistor pairs. Specifically, the respective collectors 14, 44 of transistors 11, 41, which are coupled to receive a collector bias voltage (not shown in FIG. 2), are connected in common and the respective collectors 24, 34 of transistors 21 and 31 are also coupled in common and to a collector bias voltage (not shown in FIG. 2). Modulated bias current source 60 produces a bias current which is a function of one of these collector current sums (either I1+I4 or I2+I3). Namely, the bias current source 60 is a current-dependent current source. As will be explained in detail below, by adjustment of the parameters (e.g. emitter areas) of transistor pairs 11, 41 and 21, 31, the modulated bias current produced by source 60 may be controlled to have either its maximum or its minimum value for a zero input voltage and, conversely, its minimum or maximum value when its input voltage is outside the above-referenced KT/q limit.

An understanding of the operation of the modulated bias current, differentially coupled configuration of FIG. 2 may be facilitated by an analysis of the cross-coupled collector current sums I1+I4 and I2+I3. Specifically, simplified expressions (3) and (4) for these summation values are:

$$I1+I4 = I30[1-1/(1+(A1/A2)exp(V40/VT))]+I50[1-1/(1+(A4/A3)exp(V40/VT))] \quad (3)$$

$$I2+I3 = I30/[1+(A1/A2)exp(V40/VT)]+I50/[1+(A4/A3)exp(V40/VT)] \quad (4)$$

where

A1, A2, A3 and A4 are the emitter areas of respective transistors 11, 21, 31 and 41 and VT=KT/q.

Figure 3:
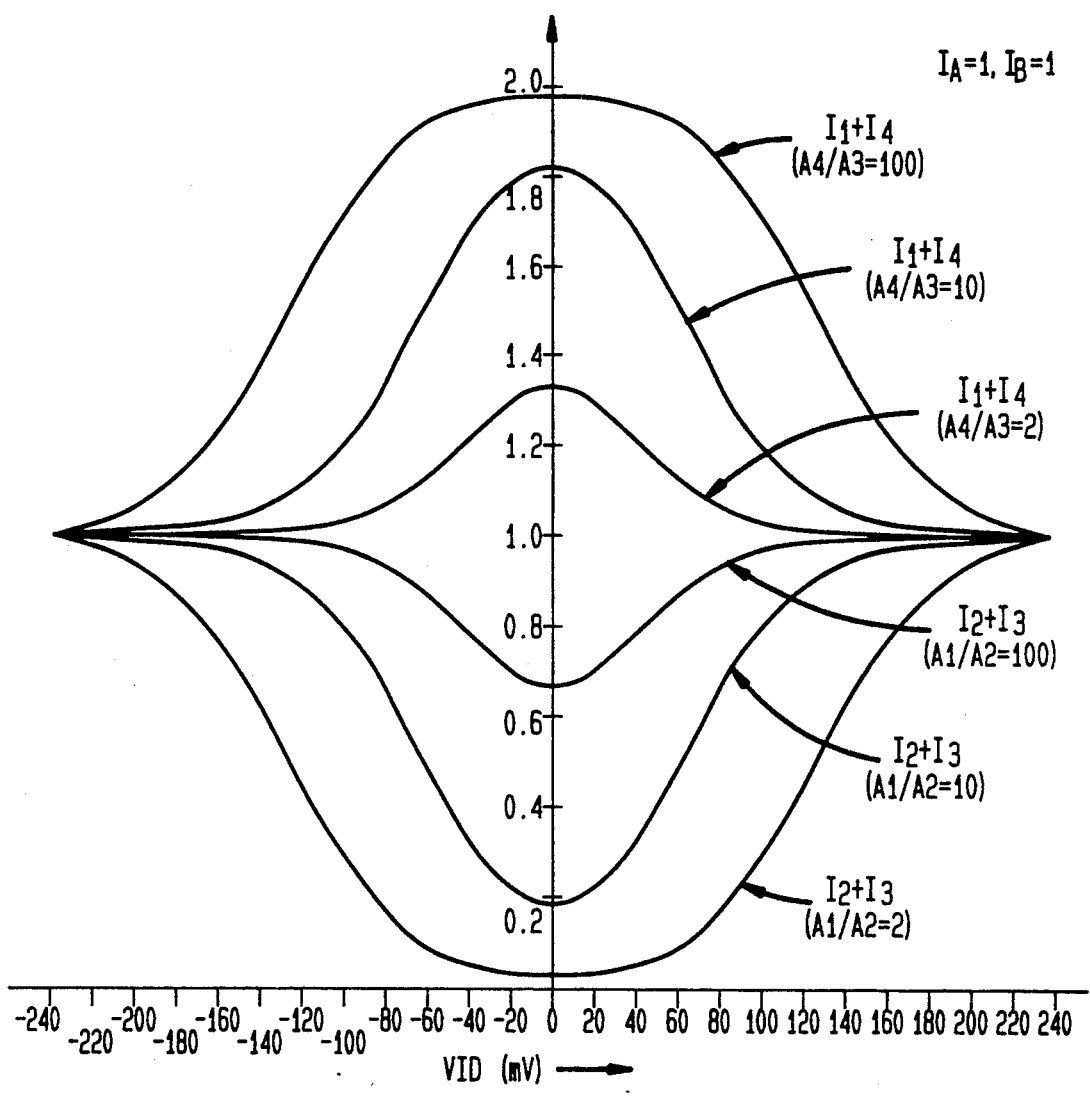
FIG. 3 is a plot of bias currents I1+I4 and I2+I3 with respect to differential input voltage, for three respective emitter area ratios for the circuit configuration of FIG. 2.

Letting each of constant bias currents IA and IB=IA, I1+I4 and I2+I3 may be plotted with respect to V40 for three respective emitter area ratios as shown in FIG. 3. In the circuit configuration of FIG. 2, if transistors 51 and 61 are part of the front end stage of an operational amplifier, as will be described below with reference to FIGS. 4–6, then, where modulated bias current I60 is a function of I2+I3, bias current modulation may be used to provide slew rate enhancement. Similarly, if transistors 51 and 61 are part of the front end stage of a comparator, then, where modulated bias current I60 is a function of I1+I4, the bias current to the differential pair is maximized as V40 approaches zero, and power dissipation can be significantly reduced when the absolute value of V40 is much greater than VT, maintaining transistors 51 and 61 at a constant temperature and thereby reducing thermal hysteresis effects.

As pointed out above, if transistors 51 and 61 are part of the front end stage of an operational amplifier, then, by making modulated bias current I60 a function of I2+I3, bias current modulation may be used to provide slew rate enhancement. This application of the present invention may be understood by reference to FIG. 4, which diagrammatically illustrates a simple operational amplifier that employs a pole splitting compensation scheme. To lower power consumption, bias currents are to be kept at a minimum and wafer occupation area is reduced through the use of a small valued compensation capacitor fC$_F$. In the circuit configuration of FIG. 4, the following parameters apply:

Gm1 = transconductance of input stage 100;
CF = compensation capacitor;
wo = small signal −3dB bandwidth;
SR = slew rate; and
IQ = the total input stage bias current, effectively IC.

Using these terms one may define:

$$wo = Gm1/C_F = IC/2VTC_F, \text{ and}$$

$$SR = IC/C_F = 2VTwo.$$

Therefore, the slew rate is limited by the small signal bandwidth. By replacing input stage 100 with the multiple differential pair configuration of FIG. 3, the relationship between the small signal characteristics (wo, Gm1) and the large signal characteristics (SR) can be changed.

Figure 5:
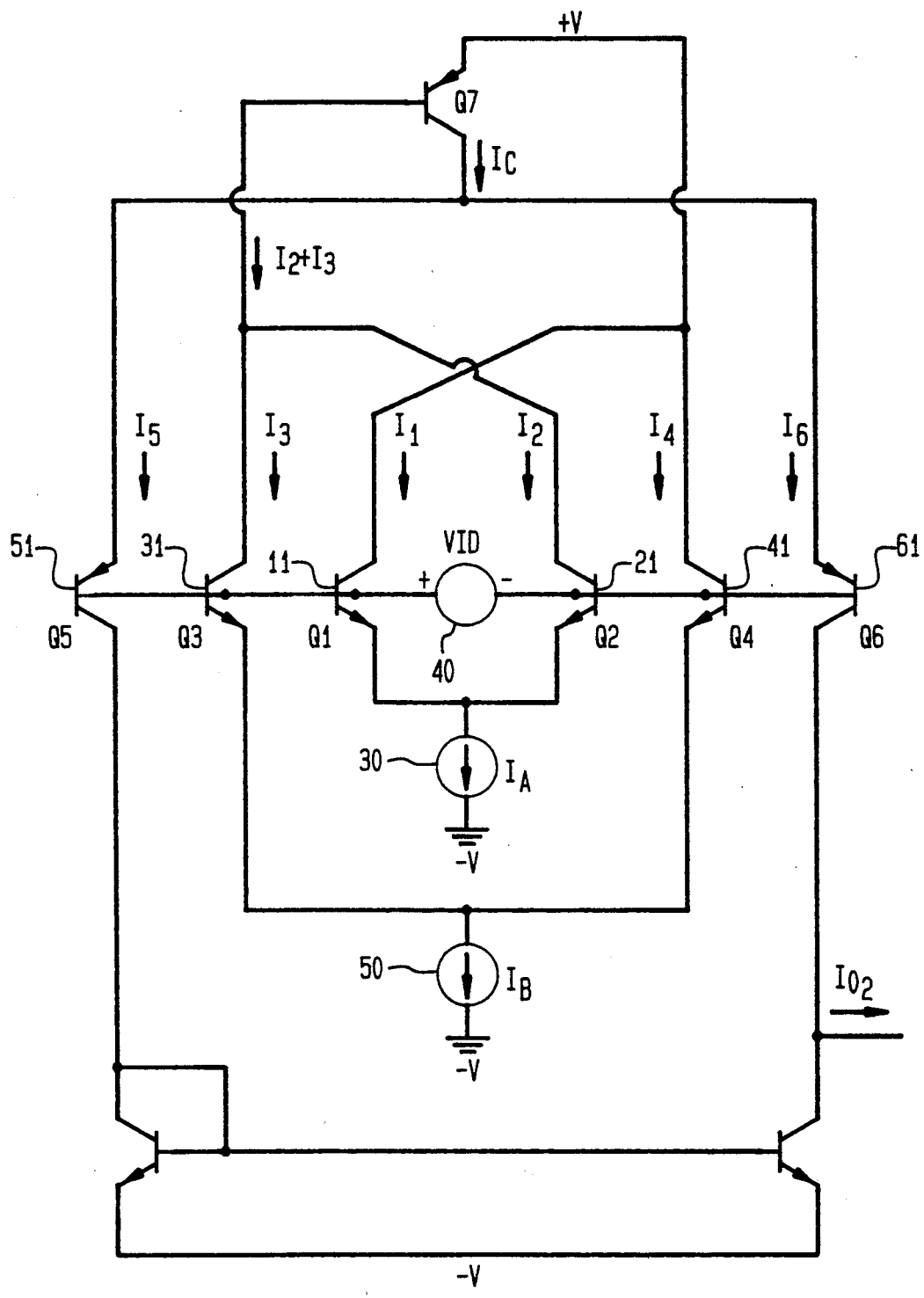
FIG. 5 diagrammatically illustrates an operational amplifier that employs the differentially coupled transistor circuit configuration of FIG. 2.

More particularly, in the circuit configuration of FIG. 5, let it be assumed that each of the emitter area ratios A1/A2 and A3/A4 = 10. As a consequence, When V40 = 0, summation current I2+I3 is approximately 0.2I30 and I60 = beta(0.2I30).

Therefore,
$$wo = Gm1/C_F = I60/2VTC_F = betaI30/10VTC_F.$$

$$IQ = 2I30 + beta(0.2I30).$$

For V40 >> VT, I2+I3 = I30 and I60 = betaI30.

$$SR = I60/C_F = betaI30/C_F = 10VTwo.$$

Figure 4:
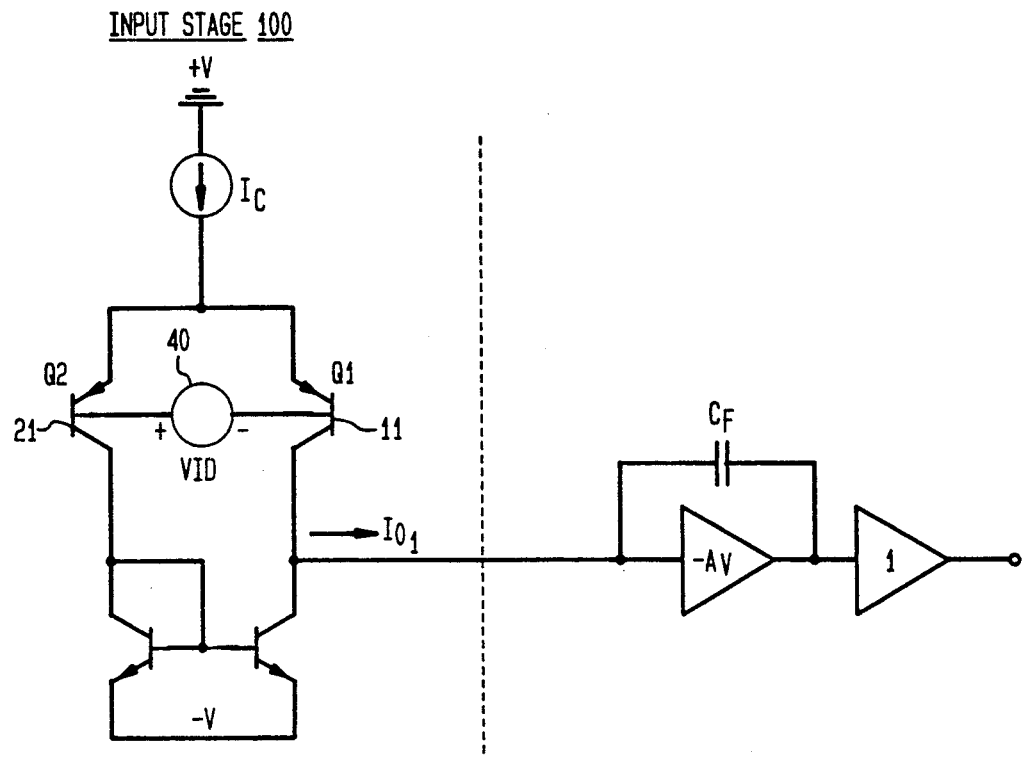
FIG. 4 diagrammatically illustrates an operational amplifier that employs the differentially coupled transistor circuit configuration of FIG. 1.

Namely, for the same small signal bandwidth wo, the slew rate of the operational amplifier configuration of FIG. 5 is five times that of the configuration of FIG. 4.

To further illustrate the enhanced functionality of the present invention, it will be assumed that the total supply current IQ to both input stages of the operational amplifier is to be the same. As illustrative parameters, let IQ 10 microamps, C$_F$ picofarads and beta = 100. For the conventional front end configuration of FIG. 4:

$IC = IQ = 10uA;$ $wo = IC/2VTC_F = 19.2\mu r/s = > fo = 3.06 \text{ MHz; and}$ $SR = 2VTwo = 1VTwo = 1V/us.$ On the other hand, for the bias current modulation configuration of FIG. 5:

$IQ = 2I30 + 100(0.2I30) = 22I30 = > I30 = 455nA;$ $wo = betaI30/10VTC_F = 17.5Mr/s = >- fo = 2.78MHz; \text{ and}$ $= 10VTwo = 4.6V/us.$ From a comparison of the two sets of parameters, the configuration of FIG. 5 has a 460% faster slew rate, yet maintains its small signal bandwidth at 91% of the configuration of FIG. 4, for the same total bias current.

Figure 6:
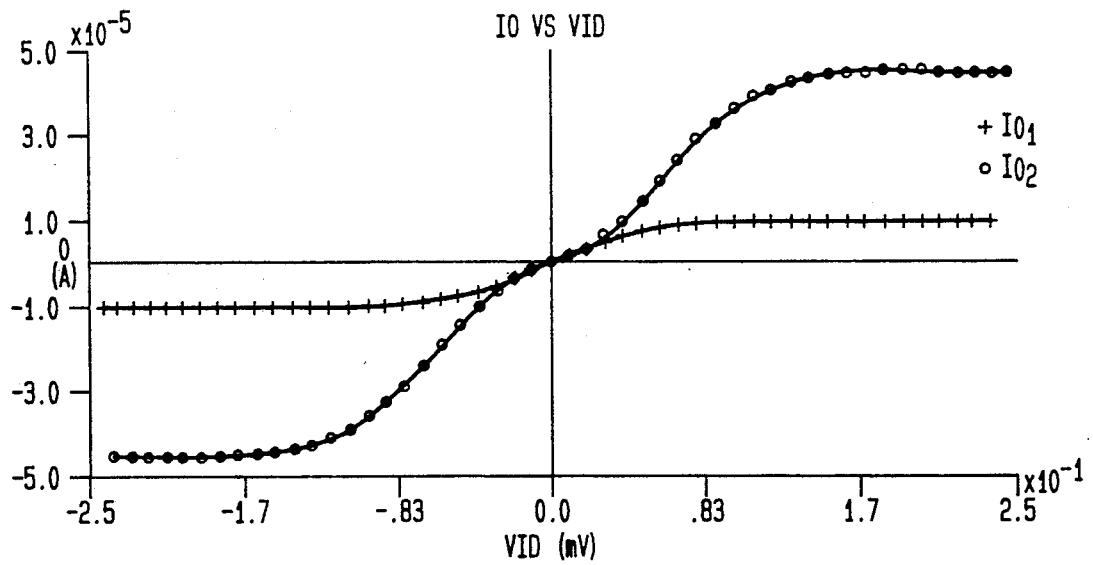
FIG. 6 is a plot of output current vs. input voltage for each of the respective input stages of FIGS. 4 and 5.

An appreciation of this vastly improved performance can be gained by plotting the output current Io vs. input voltage for each of the respective input stages of FIGS. 4 and 5, as illustrated in FIG. 6 (for $V40 = \pm 250mV$). For the configuration of FIG. 4, its output current Io1 is defined as:

$$\begin{aligned} Io1 &= I1 - I2 \\ &= IC/(1 + \exp(-V40/VT)) - IC + \\ &\quad IC/(1 + \exp(-V40/VT)) \\ &= IC[2/(1 + \exp(-V40/VT)) - 1] \end{aligned} \quad (5)$$

For the configuration of FIG. 5, its output current Io2 is defined as:

$IO2 = I6 - I5 = beta30[2/(1+\exp(-V40/VT))-1]^* [1/(1+10\exp(V40/VT))+1/(1+-10\exp(-V40/VT))]$ (6)

As can be seen from FIG. 6, for $|V50| > |VT|$ the bias current supplied by the modulation configuration of FIG. 5 is considerably larger than that supplied by the conventional circuit of FIG. 4. For $|V40| > |200mV|$, the FIG. 5 configuration provides five times the slewing current to the amplifier.

As will be appreciated from the foregoing description, operational limitations of a conventional differentially coupled transistor circuit, employing a constant current bias source, are substantially improved by a configuration which effectively modulates the bias current as a function of the differential input voltage. When the circuit is incorporated as part of a comparator, modulation of the bias current can be used to reduce power dissipation when a large differential input voltage is applied, thereby helping maintain the differentially coupled transistors at a constant temperature. In addition, when applied to an operational amplifier, bias current modulation provides slew enhancement.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A differentially coupled transistor circuit comprising:
    a pair of input terminals to which an input differential voltage is applied;
    first and second differentially coupled transistor pairs, the bases of which are coupled across said input terminals, the emitters of the first transistor pair being coupled in common to a first constant bias current source, and the emitters of the second transistor pair being coupled in common to a second constant bias current source, the collector of one of the transistors of the first pair being coupled to the collector of the differentially coupled transistor of the second pair, so as to provide a first summation collector current, the collector of one of the transistors of the second pair being coupled to the collector of the differentially coupled transistor of the first pair, so as to provide a second summation collector current;
    a third differentially coupled transistor pair, the bases of which are coupled across said pair of input terminals and the emitters of the transistors of the third pair being coupled in common to a modulated bias current source, the output current of which is a function of one of said first and second summation collector currents; and
    an output terminal coupled to the collector of one or both transistors of said third differentially coupled transistor pair from which an output current is produced.

2. A differentially coupled transistor circuit comprising:
    first and second input terminals to which an input differential voltage is applied;
    first and second transistors, each having a current input electrode, a current output electrode and a control electrode, the control electrode of said first transistor being coupled to said first input terminal, the control electrode of said second transistor being coupled to said second input terminal, and the output electrodes of said first and second transistors being coupled to a first current source;
    third and fourth transistors, each having a current input electrode, a current output electrode and a control electrode, the control electrode of said third transistor being coupled to said first input terminal, the control electrode of said fourth transistor being coupled to said second input terminal, and the output electrodes of said third and fourth transistors being coupled to a second current source, and wherein the current input electrode of one of said first and second transistors is coupled to the current input electrode of one of said third and fourth transistors;
    fifth and sixth transistors, each having a current input electrode, a current output electrode and a control electrode, the control electrode of said fifth transistor being coupled to said first input terminal, the control electrode of said sixth transistor being coupled to said second input terminal, and the output electrodes of said fifth and sixth transistors being coupled to a third current source, and wherein an output current is derived from the input electrode of one or both of said fifth and sixth transistors; and wherein
    said third current source comprises means, coupled to the intercoupled input electrodes of one of said second and third transistors and said first and fourth transistors, for supplying a modulated bias current to the output electrodes of said fifth and sixth transistors which is a function of the differential voltage applied across said first and second input terminals.

3. A differentially coupled transistor circuit according to claim 2, wherein the current input electrode of said first transistor is coupled to the current input electrode of said fourth transistor.

4. A differentially coupled transistor circuit according to claim 2, wherein the current input electrode of said second transistor is coupled to the current input electrode of said third transistor.

5. A differentially coupled transistor circuit according to claim 2, wherein the current input electrode of said first transistor is coupled to the current input electrode of said fourth transistor and the current input electrode of said second transistor is coupled to the current input electrode of said third transistor.

6. A differentially coupled transistor circuit according to claim 2, wherein said transistors comprise bipolar transistors, having collector, base and emitter electrodes, respectively corresponding to said current input, control and current output electrodes.

7. A differentially coupled transistor circuit comprising a first transistor having a first control terminal to which a first control voltage is applied, a first current input terminal to which a first input current is coupled and a first current output terminal, said first input current being controlled by the first control voltage applied to said first control terminal, and a second transistor having a second control terminal to which a second control voltage is applied, a second current input terminal to which a second input current is coupled and a second current output terminal which is coupled in common with the first current output terminal of said first transistor, said second input current being controlled by the second control voltage applied to said second control terminal, and wherein said first and second control voltages establish a differential control voltage therebetween, and further comprising a bias current circuit operatively supplying to said first and second transistors a modulated bias current which is modulated as a DC-coupled function of said differential control voltage.

8. A method comprising the steps of:
providing a first transistor having a first control terminal, a first input current terminal and a first current output terminal;
applying a first control voltage to said first control terminal so as to control a first input current applied to said first input current terminal;
providing a second transistor having a second control terminal, a second current input terminal and a second current output terminal;
connecting the first current output terminal of said first transistor and the second current output terminal of said second transistor in common;
applying a second control voltage to said second control terminal to control the second input current applied to said second input terminal, a difference between said second control voltage and said first control voltage establishing a differential control voltage therebetween; and
supplying a controlled bias current to said first and second transistors as a DC-coupled function of said differential control voltage.

9. A differentially coupled transistor circuit having first and second input terminals coupled to receive an input differential voltage, an output terminal from which an output current is provided, and a bias current source for supplying a bias current for controlling the operation of said circuit, said differentially coupled transistor circuit comprising first and second differentially coupled transistor pairs, the bases of which are coupled across said input terminals, the emitters of the first transistor pair being coupled in common to a first constant bias current source, and the emitters of the second transistor pair being coupled in common to a second constant bias current source, the collector of one of the transistors of the first pair being coupled to the collector of the differentially coupled transistor of the second pair, a first summation collector current being applied to the coupled collector of said one of the transistors of said first pair and the collector of the differentially coupled transistor of said second pair, the collector of one of the transistors of the second pair being coupled to the collector of the differentially coupled transistor of the first pair, a second summation collector current being applied to the coupled collector of said one of the transistors of said second pair and the collector of the differentially coupled transistor of said first pair, a third differentially coupled transistor pair, the bases of which are coupled across said pair of input terminals and the emitters of the transistors of the third pair being coupled in common to receive a bias current which is a function of one of said first and second summation collector currents, and wherein said output terminal is coupled to the collector of one of the transistors of said third differentially coupled transistor pair.

10. A method comprising the steps of:
providing first and second differentially coupled transistor pairs;
coupling the bases of said first and second differentially coupled transistor pairs across first and second input terminals;
coupling the emitters of the first transistor pair in common to a first constant bias current source;
coupling the emitters of the second transistor pair in common to a second constant bias current source;
applying a first summation collector current to the coupled collector of said one of the transistors of said first pair and the collector of the differentially coupled transistor of said second pair;
coupling the collector of one of the transistors of the second pair to the collector of the differentially coupled transistor of the first pair;
applying a second summation collector current to the coupled collector of said one of the transistors of said second pair and the differentially coupled transistor of said first pair;
providing a third differentially coupled transistor pair;
coupling the bases of said third differentially coupled transistor pair across said first and second input terminals;
coupling the emitters of the transistors of the third pair in common to receive a bias current which is a function of one of said first and second summation collector currents; and
coupling an output terminal to the collector of one or both the transistors of said third differentially coupled transistor pair.

* * * * *